United States Patent [19]
Simon

[11] Patent Number: 5,596,229
[45] Date of Patent: Jan. 21, 1997

[54] CHIP CARRIER STRUCTURE

[75] Inventor: James F. Simon, Portsmouth, R.I.

[73] Assignee: Raytheon Company, Lexington, Mass.

[21] Appl. No.: 392,249

[22] Filed: Aug. 11, 1989

[51] Int. Cl.$^6$ ............................. H01L 23/32; H01L 23/50
[52] U.S. Cl. ............................................. 257/727; 257/773
[58] Field of Search ................................ 357/75; 257/72.7,
257/690, 678, 726, 785, 924, 688, 719,
759, 773, 692; 439/711, 331

[56] References Cited

U.S. PATENT DOCUMENTS 4,661,886   4/1987   Nelson et al. ..................... 357/75 X
4,692,790   9/1987   Oayamda .......................... 357/75 X

*Primary Examiner*—John B. Sotomayor
*Attorney, Agent, or Firm*—Donald F. Mofford

[57] ABSTRACT

A chip carrier structure for containing a chip carrier having electrical contact pads having a positioning structure for the chip carrier and a slotted structure mated to form a mated structure containing said chip carrier, the slots of the slotted structure being in alignment with the pads of the chip carrier to provide electrical and mechanical access to the pads from the exterior to the interior of the mated positioning and slotted structures.

12 Claims, 3 Drawing Sheets

5,596,229

CHIP CARRIER STRUCTURE

The Government has rights in this invention pursuant to Contract No. N00024-87-C-6170 awarded by the Dept. of the Navy.

BACKGROUND OF THE INVENTION

This invention relates to a semiconductor chip carrier structure for testing of the chip prior to the chip being incorporated onto a printed circuit wiring board. The invention is particularly useful in the electrical testing of semiconductor devices packaged in fine pitch carriers where the separation of the electrical contacts to the conductors of the chip are very close together and where the electrical conductors are very narrow.

State of the art packaging of integrated circuits has encouraged the use of chip carrier packages having a large number of input/output (I/O) pads (148 or greater) on a fine pitch (25 to 10 mils) to house monolithic/hybrid die circuits. In the prior art, the socket systems used for test and equipment applications have not kept pace with the density achievable with package evolution. The fine pitch high I/O package has made more difficult the ability to align socket contacts for electrical contact to the I/O pads of the chip carrier packages. In addition, ship board device testing application environments challenges the ability of the socket contacts to maintain electrical connection. Also, because of the fine pitch and high quanity of I/O pads, device to socket alignment can be time-consuming. This significantly adds cost and time to testing and maintennance. It is therefore an object of this invention to provide a socket structure which provides fine pitch electrical contact alignment, integrity of the alignment for test and ship board applications, and importantly, to afford an expedient method of contact alignment that is repeatable.

SUMMARY OF THE INVENTION

The invention comprises a positioning structure for holding and positioning a leadless chip carrier, and a slotted structure which mates with the positioning structure and which contains tapered slots which are caused to be in alignment with the pads of the chip carrier. This slotted mated structure provides external access through the slots to the pads of the internal secured chip carrier. The chip carrier may be moved within the positioning structure of the mated structure and locked into position when its pads are in alignment with the slots. The mated structure is then placed into a pin holder in which resilient, electrically conductive pins extend from a planar surface. The pins are aligned with the larger opening of the tapered slots in the slotted structure when the mated structure is placed into the pin holder. The pins penetrate through the slots to the narrower opening of the slots of the mated structure by an amount sufficient to become aligned with and make spring-like electrical and mechanical contact with the pads of the chip carrier.

BRIEF DESCRIPTION OF THE DRAWINGS

The aforementioned aspects and other features of the present invention will be apparent from the following description taken in conjunction with the accompanying drawings wherein.

DESCRIPTION OF THE PREFERRED EMBODIMENT

Figure 1:
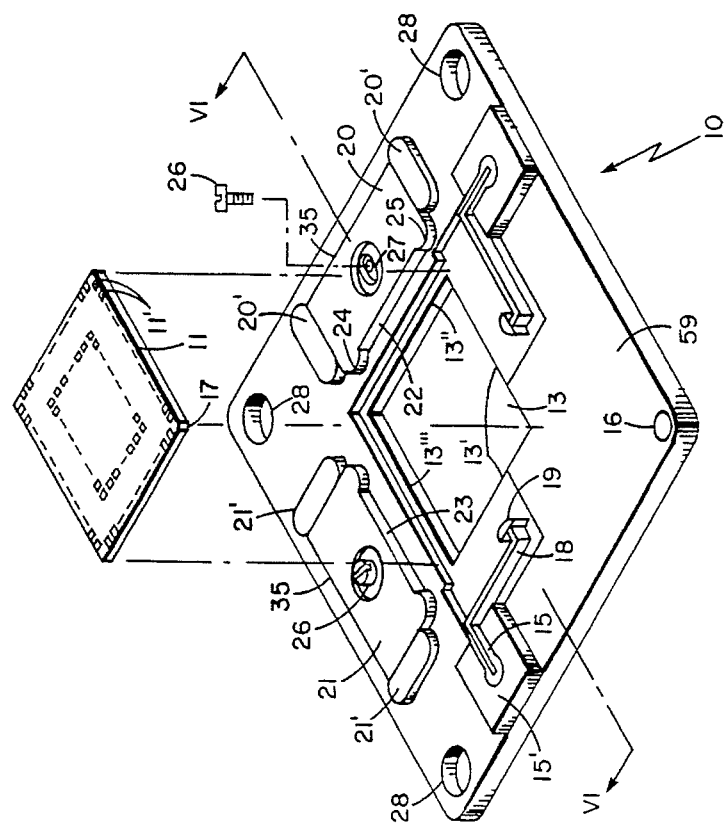
FIG. 1 is an exploded isometric view of a chip carrier and a positioning and holding structure for the chip carrier.

Referring now to FIG. 1, there is shown an isometric view of a chip carrier positioning structure 10 and a chip carrier 11 in exploded view. The positioning structure 10 (positioner) has a land 14 portion on four sides of the aperture 13 over which the chip carrier 11 rests. A keying hole 16 provide an orientation marking with respect to the leadless chip carrier 11 which has an orientation mark such as a truncated corner 17. Positioner 10 has cantilever springs 18, located at adjacent edges 13' of aperture 13. One end of spring 18, which may be of a suitable plastic or metal such as BeCu, has an electrically insulating tip 19, typically a hard plastic, and its other end is embedded in a potting plastic 15 which secures spring 18 to a boss 15' which is an integral part of base layer 59 of positioner 10. Near the remaining edges 13'', 13''' of aperture 13 are indexors 20, 21 which are movable in a direction transverse to their edges 22, 23 which are parallel to aperture edges 13'', 13''', respectively. Each indexor has projections 24, 25 which project an equal distance from edges 22, 23. Indexors 20, 21 utilize end guides 20', 21', respectively, secured to positioner 10 to allow the indexors 20, 21 to be moved transversely to their edges 22, 23, respectively. Each indexor has a locking screw 26 which is in threaded engagement with the positioner 10. Indexors 20, 21 each have a longitudinal slot 27 which allows the indexors 20, 21 to move transversely to the edges 22, 23, respectively, when the locking screws 26 have been loosened. The positioner 10 is provided with three alignment holes 28 for mating with corresponding bosses 30 of a slotted structure 12 of FIG. 2.

Figure 2:
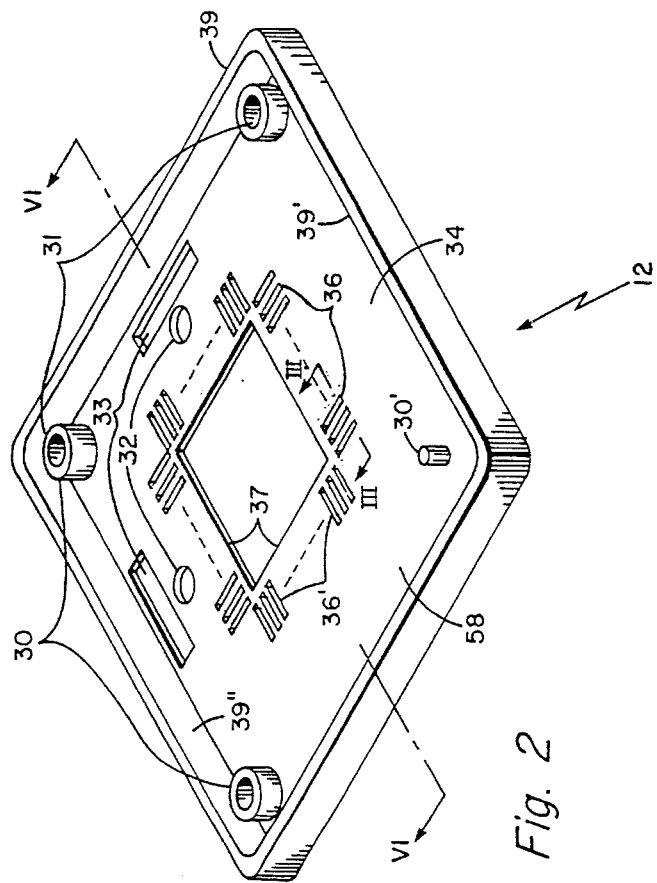
FIG. 2 is an isometric view of a slotted structure for mating with the structure of FIG. 1.

The slotted structure 12 is shown in FIG. 2. FIG. 2 shows the interior view of structure 12 showing the surface 34 of structure 12 closest to base layer 59 of positioner 10 when positioner 10 and slotted structure 12 have been placed in mating relationship. Structure 12 has three bosses 30 which mate with the three alignment holes 28 of the positioner 10. The bosses 30 have a hole 31 through each boss extending through the boss transversely to the surface 34. Structure 12 also contains a boss 30' which fills the hole 16 of the positioner 10 when the two structures 10, 12 are mated. Structure 12 also contains holes 32 which, when the two structures 10, 12 forming structure 9 are in mating relationship, are aligned with the locking screws 26. Slots 33 extend through layer 58 of structure 12 so that when the two structures 10, 12 are mated, the slots 33 provide access to the back edge 35 of each of the indexors 20, 21. Structure 12 also contains a sequence of slots 36 (pin guides) which form longitudinal holes through layer 58. The slots 36 are spaced to conform to the spacing of the pads 11' of the chip carrier 11. The sectional view of FIG. 3 taken along section line III—III of FIG. 2 shows that the slots 36 are cambered such that the width 38 of the pin guides 36 near surface 34 (nearest pads 11' in structure 9) is less than the width 38' of the pin guides 36 in the layer 58 of the slotted structure 12. The width 38 is sufficiently wide so that the pins 41 of FIG. 4 freely pass through the pin guides 36 and project above the surface 34 when assembled. The pin guides 36 are chamfered to facilitate the entry of the pins 41 which may not be perfectly aligned with the slots 36. The width 38 at surface 34 allows only minimum lateral movement of the pins 41 in order to provide more precise lateral registration of pins 41 with the pads 11' of the chip carrier 11. Only a portion of the pin guides 36 are shown in FIG. 2 to illustrate the invention more clearly. The slotted structure 12 surface 34 has a transversely extending side 39, which extends to substantially the same height as the bosses 30. The inner lateral dimension between opposite portions 39', 39" of the side 39 is sufficiently greater than the corresponding width dimension of layer 59 of the positioner 10 so that positioner 10 is recessed within the side 39 portion of slotted structure 12 when the two structures 10, 12 are mated to form mated structure 9.

Figures 3, 4:
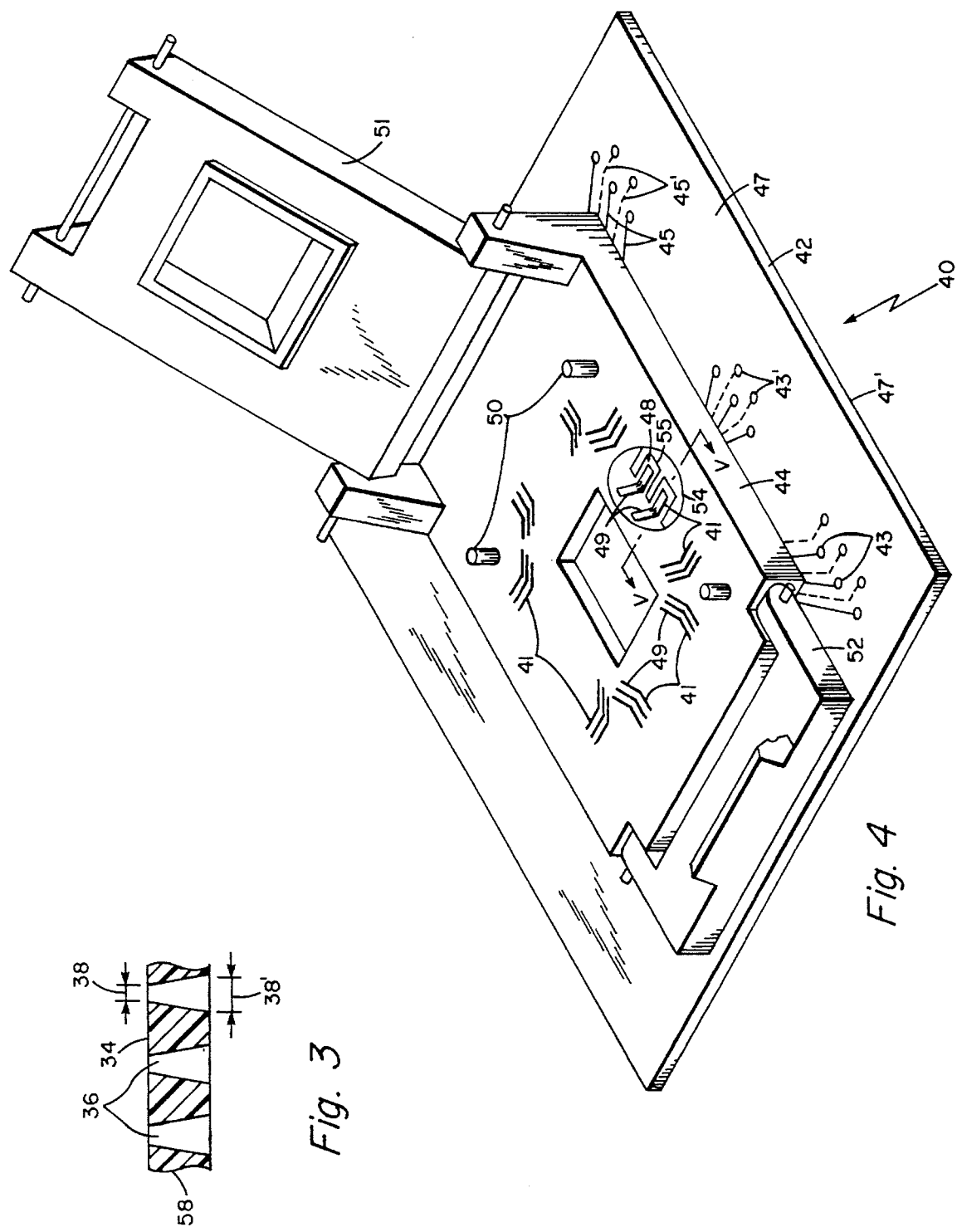
FIG. 3 is an expanded sectional view of the slotted portion of the structure of FIG. 2 taken along section line III—III.
FIG. 4 is an isometric view of a pin mounting structure.

FIG. 4 is an isometric view of the pin mounting structure 40 (pin holder) which together with the mated positioner 10 and slotted structure 12 causes the pins 41 to be correctly aligned with the pin guides 36 of FIG. 2 so that the pins 41 will project through the pin guides 36 and make contact with the pads 11' of the chip carrier 11 for electrical contact thereto. As seen in FIG. 4, the pin mounting structure 40 comprises a base plate 42 having electrical terminals 43, 43' arranged near its edges. Pins 41 are mounted on an electrically insulating support layer 44. An enlarged view 54 of the socket pins 41 and slots 48 of support layer 44 in which the pins 41 are located is shown in FIG. 4. The width 55 of a slot 48 is preferably only wide enough to accept and provide support for the pins 41.

Figure 5:
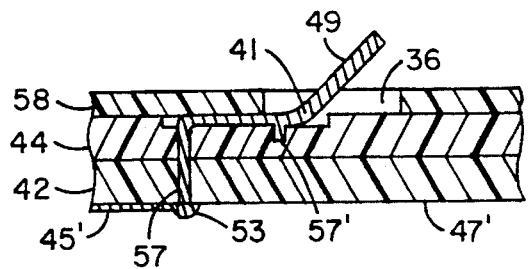
FIG. 5 is a cross-sectional view taken along section line V—V of FIG. 7 showing the relationship of a pin of FIG. 4 and a slot of FIG. 2.
Figure 7:
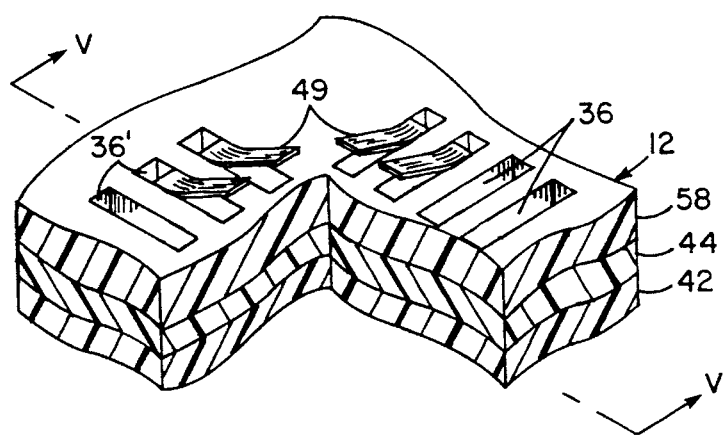
FIG. 7 is an isometric view showing in sectional view the relationship of the pins of FIG. 4 to the slotted structure of FIG. 2.

FIG. 5 is a sectional view taken along section line V—V of FIG. 7 showing a socket pin 41 with one long leg 57 extending through support layer 44 and base plate 42 to make solder connection 53 to a wire 45' on the bottom side of plate 42. The leg 57' has been cut off pin 41 to terminate in support layer 44 and thus not make electrical connection to either printed wire 45, 45'. The neighboring pins 41 would have a long pin 57' making soldered contact with printed wire 45 on the top surface of base plate 42 with a non-contacting short pin 57. Thus, each pin 41 has two legs 57, 57' inserted into corresponding holes in support layer 44, of which only one leg penetrates through support layer 44 to make contact with either the printed wiring 45, 45' on the top surface 47 and bottom surface 47', respectively, of base plate 42. Hence, alternate pins 41 penetrate layer 44 and are connected to printed wiring 45 on the top surface and thereby to terminals 43; whereas the intervening pins 41 penetrate through the layers 44, 42 to make electrical contact with printed wiring 45' on the bottom side of base plate 42 and thereby to terminals 43'. Thus, closely spaced pins 41 selectively penetrate layers 44 and 42 to make contact alternately with wider spaced printed wiring 45 and printed wiring 45'.

Each pin 41 is partially confined within a slot 48 of support layer 44 whose slots 48 are spaced to correspond to the pin guides 36 of slotted structure 12. Slot 48 in conjunction with the legs 57, 57' of each pin 41 when soldered to wiring 45, 45', respectively, hold pins 41 in place. The pins 41 have upwardly projecting portions 49 which are properly aligned to protrude through the pin guides 36, 36' in layer 58 of slotted structure 12 as described later.

Support layer 44 of pin mounting structure 40 of FIG. 4 has three posts 50 which are of the same diameter as the holes 31 of the bosses 30 of slotted structure 12 of FIG. 2. The posts 50 bear the same position relationship with respect pins 41 as do the holes 31 with respect to the slots 48 so that alignment of pins 41 and slots 48 is obtained when structures 40 and 9 are mated.

In operation, the leadless chip carrier 11 is inserted with its pads 11' showing as in FIG. 1 between the springs 18, 19 and the projections 24, 25 of indexors 20, 21 of positioner 10. The springs 18, 19 are stressed by the presence of the chip carrier 11 and thereby hold carrier 11 in positioner 10. The slotted structure 12 is then mated with the positioner 10 to form mated structure 9 by the insertion of bosses 30, 30' into the alignment holes 28, 16, respectively, of positioner 10 to form mated structure 9. The process of mating results in the pin guides 36, 36' being in near alignment with and in closely spaced relationship with the pads 11' of the chip carrier 11. The bosses 30, 30' and the holes 28, 16 are a close fit, so that when mated, the two halves 10, 12 are fixed in lateral position with respect to one another. The chip carrier 11 is also held under sufficient pressure by the distended springs 18 and 19 against the indexors 20, 21 so that the chip carrier 11 is fixed in position. The position of the chip carrier pads 11', with respect to the pin guides 36, 36' of the mated structures 10, 12 may be observed through pin guides 36. Holes 32 provide screwdriver access to screws 26. Alignment is accomplished by loosening the locking screws 26 and laterally moving indexors 20, 21 until alignment of pads 11' and pin guides 36, 36' occurs, at which time screws 26 are tightened. Alignment occurs by inserting a flat bladed tool into slot 33 to move one of the indexers 20, 21 within guides 20', 21, respectively, to thereby cause movement of the chip carrier 11 relative to a pair of the pin guides 36 or 36' until the pads 11' are aligned.

Figure 6:
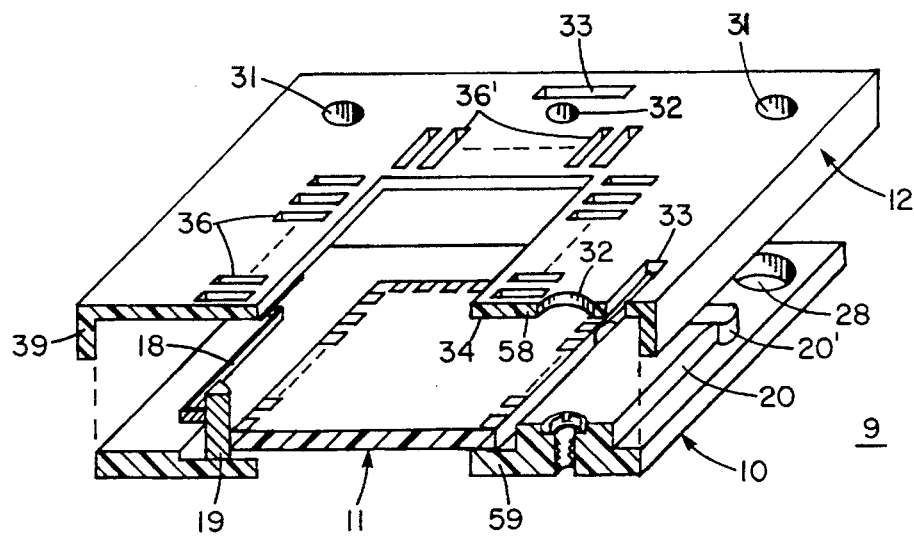
FIG. 6 is a partially exploded cross-sectional view taken along sections line VI—VI of the assembly of the structure of FIGS. 1 and 2.

The chip carrier assembly 9 shows sectional and exploded view in FIG. 6 of the mated structures 10, 12 and chip carrier 11 is then inserted into the pin mounting structure 40 by inserting the posts 50 of structure 40 into the holes 31 of the bosses 30 of the assembly 9. The sectioning is along midsection line VI—VI of FIGS. 1 and 2. The pins 41 are thereby in alignment with the pin guides 36, 36' thereby allowing the pin 41 portion 49 to pass through the pin guides 36, 36' and make electrical and mechanical contact with the pads 11' of the chip carrier 11. Electrical connections to the terminals 43, 43' of mounting structure 40 allow the chip carrier 11 to be tested.

The pin mounting structure 40 has a hinged cover 51 and hinge latch 52. The cover 51 is opened for insertion of the assembly 9 containing the chip carrier 11. Closing the cover 51 and latching it to the latch 52 causes the cover 51 to provide downward pressure on the assembly 9 and, therefore, pressure on the chip carrier pads 11' against the contacting pins 41 whose upper portions 49 are thereby slightly deflected. Good electrical connection between the chip carrier pads 11' of carrier 11 and the electrical terminals 43, 43' of the socket pin mounting structure 40 is thereby provided to assure reliable electrical testing of the chip carrier.

FIG. 7 is a sectional view showing only the socket pin 41 portion 49 protruding through the slots 36, 36' of the slotted structure 12 after the assembly 9 has been placed in the socket pin mounting structure 40.

Having described a preferred embodiment of the invention, it will now be apparent to one of skill in the art that other embodiments incorporating its concept may be used. It is believed therefore that this invention should not be restricted to the disclosed embodiment but, rather, should be limited only by the spirit and scope of the appended claims.

What is claimed is:

1. A chip carrier structure for containing a chip carrier having electrical contact pads comprising:

a first mounting and positioning structure for said chip carrier;

a second slotted structure;

said first and second structures being detachably mated to form a third structure containing said chip carrier; and said slots of said second structure being in alignment with the pads of said chip carrier to provide electrical and mechanical access to said pads, said access being from exterior to interior of said third structure.

2. The chip carrier structure of claim 1 adapted to be used in combination with an electrically connecting pin mounting structure having electrically-connecting pins, the improvement comprising:

said mated first and second structures being adapted to mate with said pin mounting structure to align said electrically-connecting pins with said slots to cause to pins to extend through said slots to make electrical and mechanical contact with said pads.

3. The structure of claim 2 wherein:

said pin mounting structure has first alignment posts; and said third structure has corresponding first alignment holes adapted to mate with said first posts to cause said pins to be in alignment with said slots and thereby allow said pins to penetrate through said slots and make electrical contact with said pads when said first posts and said first holes are mated.

4. A chip carrier structure for operation in combination with a chip carrier comprising:

a first mounting and positioning structure for said chip carrier comprising:

a planar base layer;

a first spring a and a second spring attached to said base layer and each making spring contact with an adjacent side of said chip carrier; and first and second chip carrier positioning means for moving said chip carrier in orthogonal directions, respectively, parallel to the planar base layer against said first and second springs, respectively.

5. The chip carrier structure of claim 4 wherein said first and second chip carrier positioning means each comprise:

a moveable member in contact with said chip carrier;

a pair of guides; and said guides preventing movement of said member other than in the direction of said chip carrier, said member having a locking means.

6. The chip carrier structure of claim 5 wherein said locking means comprises:

a screw having a head and thread position;

said moveable member having a slot in the direction of allowable movement of said member accepting said screw;

a screwthread in said planar base accepting said screw threaded position; and the head of said screw in contact with said moveable member to lock said moveable member in position against said base layer when said screw is threadedly tightened in said screwthread.

7. A chip carrier structure for operation in conjunction with a chip carrier positioner having chip carrier adjusting means, a chip carrier having pads, and a pin mounting structure comprising:

a slotted structure comprising:

a plurality of slots corresponding to the pads of said chip carrier; and means for mating said slotted structure to said chip carrier positioner to cause said chip pads to be approximately in alignment with said slots.

8. The structure of claim 7 wherein said means for mating comprises:

said slotted structure having bosses corresponding to holes in said chip carrier positioner for mating therewith.

9. The structure of claim 7 wherein said slotted structure further comprises:

a pair of screw access holes;

a pair of positioner access slots;

said screw access holes and positioner access slots comprising access to said chip carrier adjusting means.

10. The structure of claim 7 wherein:

said slots are tapered having a width sufficient to allow said pins of said pin mounting structure to move in said slots at a surface of said slotted structure nearest said chip carrier; and having a larger width on the side adjacent said pin mounting structure.

11. A method of mounting a chip carrier having electrical contact pads for electrical testing of a chip contained on said carrier comprising the steps of:

inserting said chip carrier into a chip carrier positioning structure;

mating said positioning structure with a slotted structure having slots corresponding to the pads on said chip carrier to provide a mated structure;

moving said chip carrier within said mated structure to a locking position to provide alignment of said pads and said slots by a positioning means; and locking said positioning means at said locking position.

12. The method of claim 11 further comprising the step of:

inserting said mated structure after said locking step into a pin holder having electrically conducting pins to cause said pins to penetrate through said slots to make electrical contact with said pads.

* * * * *